United States Patent
Pullmann et al.

(10) Patent No.: US 7,548,159 B2
(45) Date of Patent: Jun. 16, 2009

(54) METHOD AND DEVICE FOR RELIABLY MONITORING A CLOSED POSITION OF TWO PARTS MOVEABLE RELATIVE TO ONE ANOTHER

(75) Inventors: Juergen Pullmann, Ebersbach (DE); Christoph Zinser, Wolfschlugen (DE); Thomas Nitsche, Esslingen (DE)

(73) Assignee: Pilz GmbH & Co. KG, Ostfildern (DE)

( * ) Notice: Subject to any disclaimer, the term of this patent is extended or adjusted under 35 U.S.C. 154(b) by 382 days.

(21) Appl. No.: 11/332,873

(22) Filed: Jan. 13, 2006

(65) Prior Publication Data

US 2006/0181417 A1    Aug. 17, 2006

Related U.S. Application Data

(63) Continuation of application No. PCT/EP2004/007814, filed on Jul. 15, 2004.

(30) Foreign Application Priority Data

Jul. 21, 2003    (DE) ................. 103 34 653

(51) Int. Cl.
   *G08B 13/08* (2006.01)
(52) U.S. Cl. ................. 340/545.1; 340/825.29
(58) Field of Classification Search ............. 340/545.1, 340/825.29; 235/449
   See application file for complete search history.

(56) References Cited

U.S. PATENT DOCUMENTS 4,433,309 A    2/1984   Hermle et al.
4,773,094 A *  9/1988   Dolby ................ 381/58
6,409,083 B1 * 6/2002   Link ................ 235/449

FOREIGN PATENT DOCUMENTS

| DE | 30 07 929 A1 | 9/1981 |
| DE | 34 40 027 A1 | 5/1986 |
| DE | 40 41 550 A1 | 6/1992 |
| DE | 42 33 922 A1 | 5/1994 |
| DE | 44 38 039 A1 | 5/1996 |
| DE | 196 49 593 A1 | 6/1998 |
| DE | 199 01 984 A1 | 8/2000 |
| DE | 100 00 799 C1 | 5/2001 |
| DE | 10000799 C1 * | 5/2001 |
| EP | 0 968 567 B1 | 7/2001 |

* cited by examiner

*Primary Examiner*—Daniel Wu
*Assistant Examiner*—Shirley Lu
(74) *Attorney, Agent, or Firm*—Harness, Dickey & Pierce, P.L.C.

(57) ABSTRACT

A device for reliably monitoring a closed position of two parts which can move relative to one another has an actuator and a sensor. The device is particularly used for monitoring the closed position of a protective door installed for safeguarding a technical installation which operates in an automated fashion. The sensor has a receiver circuit at an input side, which circuit generates a defined receiver circuit signal when a switching distance between the sensor and the actuator is fallen short of. A detector circuit provides an enable signal when the defined receiver circuit signal is present. According to one aspect of the invention, a test element is provided for selectively suppressing the defined receiver circuit signal.

12 Claims, 2 Drawing Sheets

METHOD AND DEVICE FOR RELIABLY MONITORING A CLOSED POSITION OF TWO PARTS MOVEABLE RELATIVE TO ONE ANOTHER

CROSSREFERENCES TO RELATED APPLICATIONS

This application is a continuation of international patent application PCT/EP2004/007814 filed on Jul. 15, 2004 and published in German language as WO 2005/013488, which international patent application claims priority from German patent application DE 103 34 653.8 filed on Jul. 21, 2003.

BACKGROUND OF THE INVENTION

The present invention relates to a method and a device for reliably monitoring a closed position of two parts which can move relative to one another. More particularly, the invention relates to a protective door switch and method for monitoring a closed position of a protective door installed for safeguarding a technical installation operating in an automated fashion.

Prior art devices of this type are primarily used in the field of machine and installation safety when the goal is to avoid hazards arising from an installation which operates in an automated fashion. In addition to other protective measures such as light barriers, safety mats, two-hand switches etc., protective doors or flaps or the like are frequently used to separate persons from hazardous locations. The doors are typically provided with an actuator-sensor combination for detecting an opening of the protective door in a reliable, i.e. failsafe, manner so that the machine or installation can be placed in a non-dangerous state, if appropriate. Suitable actuator-sensor combinations thus belong to the field of components which typically require an approval from competent supervisory authorities before use. The present invention relates in particular to devices and methods of the type mentioned at the beginning which meet at least category 3, preferably even the highest category 4, of pertinent European standard EN 954-1 or comparable safety requirements for safeguarding technical installations.

Among the actuator-sensor combinations available in the art, those which interact in a non-contact fashion have been given particular attention. Such devices are generally based on magnetic and/or electromagnetic couplings between the actuator and the sensor, which couplings are interrupted or disrupted when the protective door opens. However, magnetic sensors cannot be used, or can only be used to some degree, in some fields, such as in the metal cutting machining of metallic workpieces.

In order to achieve the required failsafety, prior art devices are generally designed with two-channel redundancy. By way of example, reference is made to documents DE 40 41 550 A1 or DE 44 38 039 A1.

Document EP 0 968 567 B1 discloses a prior art device where the actuator is a transponder which can transmit an internally stored code to a sensor (referred to as a reading head in that document) in a non-contact fashion if the distance between the actuator and sensor falls short of a specific switching distance. An evaluation device which has two-channel redundancy is connected downstream of the sensor-end receiver circuit which is used to read out the transponder, said evaluation device evaluating the sensor signal supplied by the receiver circuit and opening, as a function thereof, two outputend relays with which, for example, a monitored machine is then switched off.

This known device has the disadvantage that when a plurality of protective doors are monitored a corresponding number of evaluation devices is necessary. As an alternative to this, it is basically conceivable to evaluate a plurality of actuators with a common evaluation device; however, in this case either the reaction time of the device and/or its complexity increases.

SUMMARY OF THE INVENTION

Against this background, it is an object of the present invention to provide an alternative concept for a method and a device of the type mentioned at the beginning which allow to monitor a plurality of protective doors quickly, reliably (in the sense of in a failsafe way) and efficiently.

According to one aspect, this object is achieved by a device for reliably monitoring a closed position of two parts moveable relative to one another, the device comprising an actuator and a sensor each for mounting to one of the parts, the sensor having a receiver circuit for generating a defined receiver circuit signal when the distance between the sensor and the actuator is less than a predetermined switching distance, further comprising a detector circuit for providing an enable signal when the defined receiver circuit signal is present, and comprising a test element designed to selectively suppress the defined receiver circuit signal.

According to another aspect, this object is achieved by a method for reliably monitoring a closed position of two parts moveable relative to one another, the method comprising the steps of: arranging an actuator on one of the parts, arranging a sensor having a receiver circuit on the other of the parts, generating a defined receiver circuit signal using the receiver circuit if the distance between the sensor and the actuator falls below a predetermined switching distance, and generating an enable signal using a detector circuit if the defined receiver circuit signal is present, and when the defined receiver circuit signal is present, briefly suppressing the defined receiver circuit signal using a test element and generating a monitoring message if the detector circuit does not react to the suppression of the defined receiver circuit signal.

According to yet another aspect, there is provided a sensor for detecting the presence of an actuator mounted to a first part that is moveable relative to a second part, the sensor being adapted to be mounted to the second part and comprising a receiver circuit for generating a defined receiver circuit signal when the actuator comes close to the sensor, comprising a detector circuit for providing an enable signal when the defined receiver circuit signal is present, and comprising a test element designed to selectively suppress the defined receiver circuit signal.

The test element is preferably a transistor, a relay, a PIN diode or some other electrical, electronic or even optical switching element which can be used to switch over from a monitoring mode which normally takes place to a brief test mode. Electrical/electronic or optical switching elements are preferred here since they allow to change into the test mode without any mechanical actions such as the brief opening or release of the protective door. Basically, however, the test element can also be mechanical. In other words, in the most general form of the invention the important factor is that automatic testing of the sensor-actuator combination is possible from the outside using the test element.

By using the test element it is possible to check the validity of the defined receiver circuit signal, which signals a closed (protective) door when the device is operating satisfactorily, from the outside. This in turn allows to make the detector circuit used for evaluating the receiver circuit signal relatively simple in design. In contrast to devices of the prior art it is therefore no longer necessary that the enable signal of the detector circuit is in itself a failsafe switching signal. In other words, owing to the new concept it is possible to permit the detector circuit to supply an enable signal which does not in itself allow any failsafe conclusions to be drawn about the closed position of the (protective) door. However, by using the new test element it is possible to check for the plausibility of the enable signal from the detector circuit from the outside so that overall the desired failsafe conclusion about the closed position of the (protective) door is still possible.

Owing to the new concept it is possible to implement the detector circuit for evaluating the receiver circuit signal very cost-effectively and also with very small dimensions. This in turn permits the detector circuit to be integrated cost-effectively into the sensor on any (protective) door. It is therefore possible to secure a plurality of protective doors with cost-effective actuator-sensor combinations. The final decision about switching off the monitored installation can be moved to where a test signal which is to be supplied to the new switching element is generated and monitored, preferably to a remote, failsafe switching device or a central safety controller which was usually also present in previous configurations.

Since the remote safety switching device or the central safety controller is not assigned the function of evaluating the original receiver circuit signals of the individual actuator-sensor combinations, the reaction time of the overall device is not increased even when a plurality of actuator-sensor combinations are monitored.

Overall, the new concept thus provides the possibility of safeguarding a plurality of protective doors with comparatively simple and cost-effective actuator-sensor combinations and without a disadvantageous effect on the complexity of the arrangement and/or the reaction time of the overall device.

When a non-mechanical test element is used, the new concept also has the advantage that the suppression of the receiver circuit signal simulates the "critical" situation, specifically that the actuator is removed from the vicinity of the sensor, in a very realistic way without, however, the (protective) door having to be actually opened, which would result in a loss of safety. As a result of this realistic simulation, the overall safety circuit can be checked for satisfactory functioning in only one test cycle, which allows to safeguard an hazardous installation reliably.

In a preferred embodiment of the invention, the test element is arranged in the region of the receiver circuit.

This embodiment has the advantage that the receiver circuit signal can be suppressed "at the place where it is generated", as a result of which the simulation used to check the overall device is made even more realistic. Furthermore, in this way the monitoring is largely decoupled from the length of the feed lines to the switching element and is thus independent of installation-specific conditions. Finally, in this configuration the test element can be very easily integrated into the sensor, which facilitates manufacturer-end functional and quality control and also the installation of the device in situ.

In a further embodiment, the receiver circuit comprises an inductor and a capacitor connected thereto, and the switching element is designed to isolate the inductor and the capacitor from one another electrically.

Such an arrangement of the switching element has proven particularly effective since the receiver circuit is made "unusable" by the disconnection of the inductor and capacitor. As a result, the receiver circuit signal is suppressed very easily and with conditions which are particularly close to reality compared to the opening of the protective door.

In another embodiment the switching element is designed to isolate the receiver circuit from the detector circuit.

In this embodiment, the receiver circuit signal is not necessarily suppressed in the narrower sense even if this is nevertheless generally the consequence with known integrated circuits for evaluating transponders. However, the decisive factor for the practical implementation of the new concept is not predominantly that the receiver circuit signal "disappears" but rather that it no longer reaches the downstream detector circuit so that the latter must assume that the (protective) door opens. This can also be achieved within the scope of the present invention by the receiver circuit in itself remaining intact but being disconnected from the detector circuit. The term "suppressed" therefore means in this context that the receiver circuit signal "disappears" from the detector circuit's point of view. An advantage of this embodiment is in particular the fact that the inductor and the capacitor of an oscillatory circuit can still be connected directly with one another. This facilitates the precise tuning of the oscillatory circuit and thus its accuracy and stability in terms of frequency.

In a further embodiment, the actuator comprises a transponder element with information stored therein and the sensor is designed to read out the information using the receiver circuit when the defined distance is less than a predetermined switching distance. The actuator is preferably a transponder.

Suitable transponders have now become available as standard products for numerous applications such as, for example, for immobilizers in motor vehicles. Likewise, there are integrated circuits which are largely ready for use and which are designed to read out information stored in the transponders and make it available as a data value. Generally uniquely defined information is available in the form of an identification number which the transponder outputs in the form of an amplitude-modulated response signal in response to electromagnetic excitation. This response signal can be picked up using the receiver circuit at the input side, with the defined receiver circuit signal then receiving the transponder information. The present embodiment has the advantage that owing to the (preferably individual) information a redundancy is provided which can be evaluated advantageously in the sense of failsafety. In particular, by evaluating the information stored in the transponder it is possible to prevent "any" actuator being used instead of the actuator provided by the manufacturer. Desired or undesired manipulations which endanger safety are in this way made significantly more difficult, if not even impossible.

In a further embodiment, the sensor is designed to read out the information in a continuously repeated fashion when the defined distance is less than a predetermined switching distance.

This embodiment easily generates a dynamic behavior with which the failsafety of the device can be improved further and even more easily.

In a further embodiment, the detector circuit comprises a logic module which provides the enable signal only if the information from the actuator corresponds to predefined information.

This embodiment takes up the idea already mentioned above of evaluating the information of the transponder in order to avoid manipulation and to increase the failsafety. The failsafety and manipulability of the device can thus be improved even further.

In a further embodiment, the detector circuit has an operating mode in which the logic module reads in the predefined information, specifically preferably from the actuator.

In this embodiment, the detector circuit is thus "trainable", i.e. it can be trained to the individual information of an individual transponder. Alternatively, it would basically also be possible to use transponders with uniform information within one production series. The preferred embodiment makes manipulation even more difficult and correspondingly improves failsafety even further.

In a further embodiment, there is also an evaluation and control unit, preferably spatially remote from the sensor, and said evaluation and control unit is designed to suppress the first receiver circuit signal cyclically using the switching element.

This embodiment makes advantageous use of the possibilities provided by the new concept since cyclical suppression of the receiver circuit signal permits cyclically checking of the enable signal for plausibility. The use of an evaluation and control unit, for example in the form of a safety switching device or a safety controller, which is spatially remote from the sensor permits cost-effective and efficient monitoring of a plurality of protective doors from a central unit here. Furthermore, this embodiment permits the detector circuit and the sensors to be constructed in a very cost-effective way with small dimensions.

In a further preferred embodiment, the detector circuit is integrated into the sensor, and, in particular, it is arranged together with the receiver circuit in a sensor housing.

This embodiment simplifies the installation of the overall device and additionally permits reliable quality and fault control by the manufacturer. Furthermore, in this embodiment the test mode takes place "right at the front", i.e. the overall device is checked in conditions which are very close to reality by the suppression of the receiver circuit signal.

The detector circuit is preferably of single-channel design. In particular it has only one so-called Tag reader IC, i.e. only one circuit for evaluating a transponder code, and/or only one (relatively simple) microprocessor.

This embodiment makes advantageous use of the possibilities of the new concept since the detector circuit can be implemented very easily with small dimensions and thus also very cost-effectively here. In addition, the consideration of faults prescribed in safety applications is simplified, which further reduces development costs.

It goes without saying that the features which are explained above and those which are still to be explained below can be used not only in the respectively specified combination but also in other combinations or in isolation without departing from the scope of the present invention.

BRIEF DESCRIPTION OF THE FIGURES

Exemplary embodiments of the invention are illustrated in the drawing and will be explained in more detail in the following description, in which.

DESCRIPTION OF PREFERRED EMBODIMENTS

Figure 1:
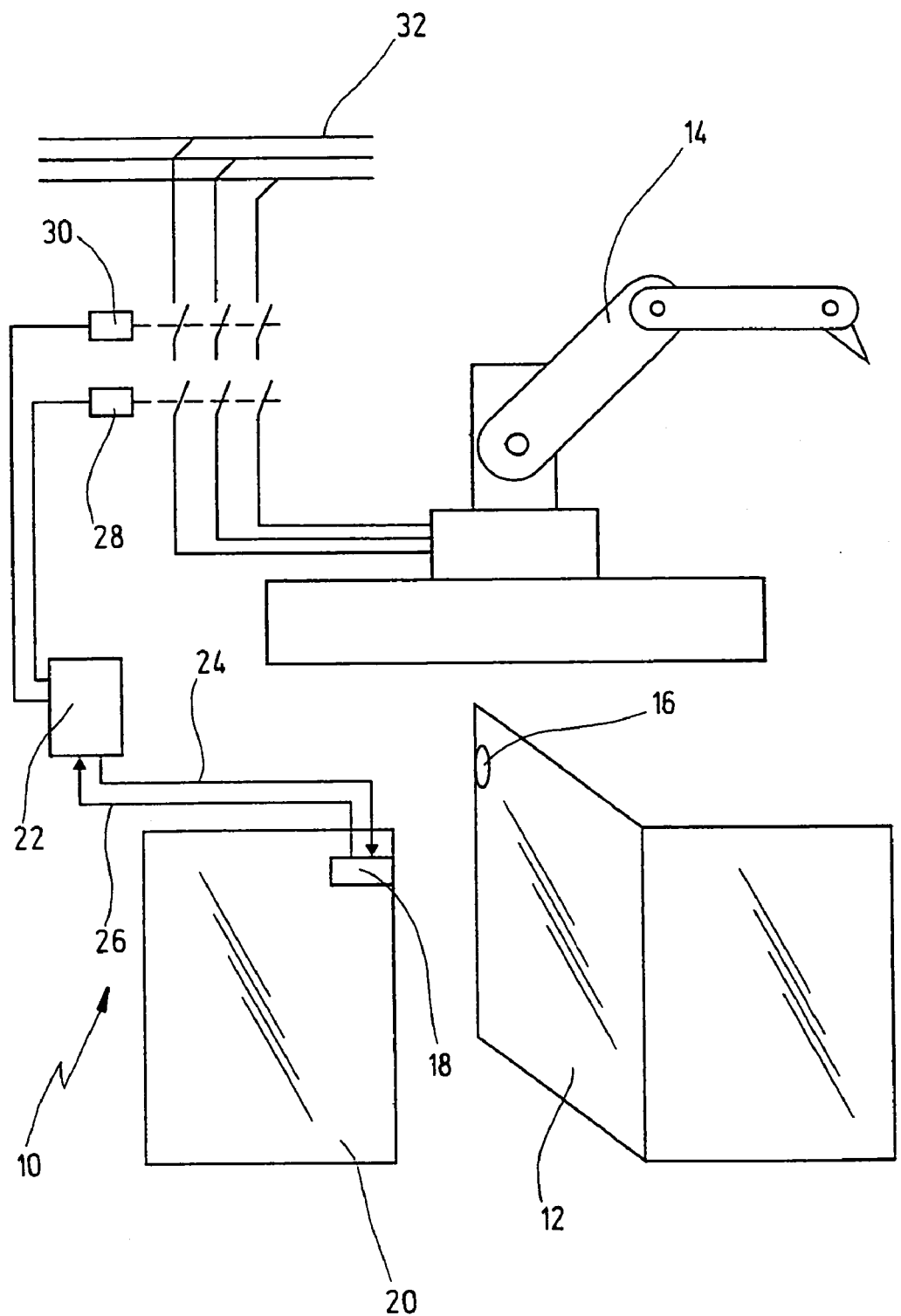
FIG. 1 shows a schematic illustration of a device according to the invention for safeguarding an installation which operates in an automated fashion.

In FIG. 1, an exemplary embodiment of the new device is designated in its entirety by reference number 10.

The device 10 here serves for monitoring the closed position of a protective door 12 which is itself provided for safeguarding an installation which operates in an automated fashion. The installation operating in an automated fashion is represented by way of example here as a robot 14. However, the field of use of the new device 10 is not restricted to this specific example. Generally, the device 10 can be used for monitoring any (closed) positions of two parts which can move relative to one another. This includes, for example, also the monitoring of a piston position relative to a piston cylinder or some other piston, with the term "closed position" meaning in this case that the piston is located in the region of the other object.

The device 10 comprises an actuator 16 and a sensor 18. The actuator 16 is here mounted on the protective door 12. The sensor 18 is mounted on a wall 20 (or on a frame, not illustrated here, for the protective door 12). In the closed state of the protective door 12 (not illustrated here) the actuator 16 is located in the spatial vicinity of the sensor 18, which causes an enable signal to be generated in the way explained in more detail below. When the protective door 12 opens, the actuator 16 is removed from the sensor 18, which results in the enable signal being cancelled and a monitoring message, here in the form of a switching signal for switching off the robot 14, being generated.

The sensor 18 is connected to a safety switching device 22 via two lines in this exemplary embodiment. The first line 24 leads from the safety switching device 22 to the sensor 18. The safety switching device 22 can transmit test signals to the sensor 18 in the way explained in more detail below via this line. Via the second line 26, the safety switching device 22 receives the enable signal generated by the sensor 18.

At the output end, the safety switching device 22 controls two contactors 28, 30 whose working contacts are arranged in a power supply line 32 of the robot 14 in a manner known per se. Via the contactors 28, 30, the safety switching device 22 interrupts the power supply for the robot 14 if opening of the protective door 12 is detected using the actuator-sensor combination 16, 18, or if an undefined state, which is thus critical for safety, is detected by the fault monitoring process described below.

According to a preferred exemplary embodiment, the safety switching device 22 is a device which fulfills the category 4 of the European standard EN 954-1 or a comparable safety standard and which is correspondingly approved for safeguarding technical installations. For example, this is a safety switching device of the type PNOZ®elog of the applicant of the present invention. However, as an alternative to this the sensor 18 could also be connected to a programmable safety controller as it is also marketed under the brand name PSS® by the applicant of the present invention.

In the exemplary embodiment according to FIG. 1, only one actuator-sensor combination 16, 18 is illustrated. However, it goes without saying that in other exemplary embodiments a plurality of such combinations can also be used to monitor the closed position of numerous parts in a failsafe fashion. In preferred exemplary embodiments a plurality of actuator-sensor combinations 16, 18 are connected to a common safety switching device 22 (or a common safety controller), which permits particularly efficient and cost-effective safeguarding of an entire installation.

Figure 2:
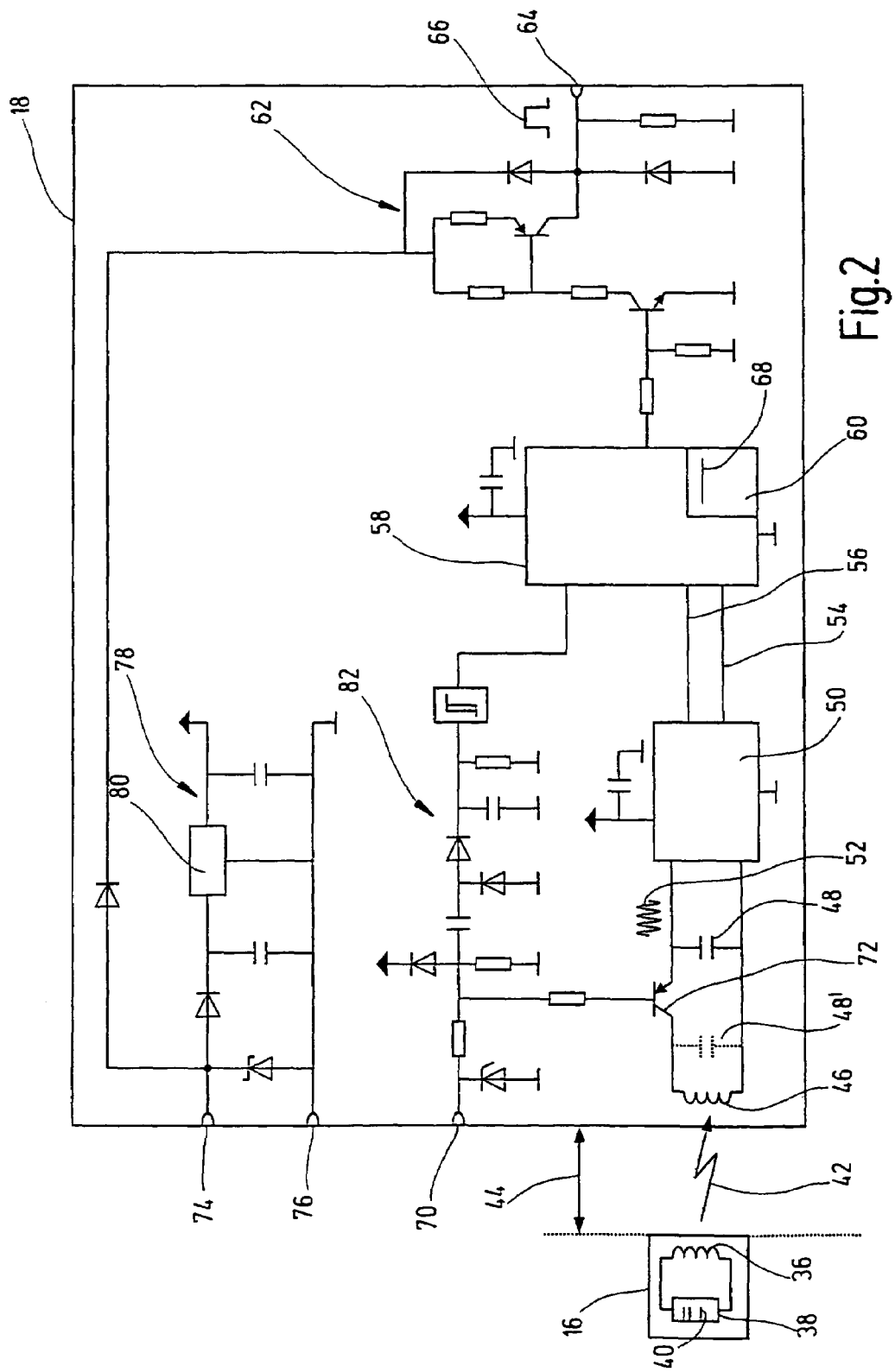
FIG. 2 shows a simplified electrical circuit for a preferred exemplary embodiment of the actuator-sensor combination of the new device.

The actuator-sensor combination 16, 18 from the exemplary embodiment of FIG. 1 is illustrated in further details in FIG. 2, with the same reference symbols designating the same elements as before.

The actuator 16 is a commercially available passive transponder here (also sometimes referred to as "tag" in the specialist language). It has at least one coil 36 and a memory 38 in which information 40, in particular an identification number, is stored. The coil 36 forms an antenna via which the actuator 16 can pick up and emit electromagnetic signals. If the actuator 16 is moved close enough to a transmitter which emits a suitable interrogation signal in the form of an electromagnetic field, it picks up energy via the coil 36. The memory 38 is actuated with this energy and a modulator (not illustrated here) generates an electromagnetic response signal 42 on which the information 40 is impressed. The response signal 42 can be received and evaluated with a suitable sensor. In particular it is thus possible to transmit the information 40 stored in the actuator 16 to the sensor in a non-contact fashion. It is characteristic for the application preferred here that the transponder is actuated automatically if it is moved close enough to the sensor 18 since the sensor 18 generates, in the way described in more detail below, the electromagnetic field which actuates the transponder in the actuator 16.

On the other hand, if the distance between the actuator 16 and sensor 18 is too large, the energy of the electromagnetic field which is generated by the sensor 18 is not sufficient to actuate the transponder. As a result of this, the transponder in the actuator 16 then does not emit a response signal 42 either, which is interpreted here as an opened protective door 12. The maximum switching distance within which the transponder in the actuator 16 emits a response signal 42 which can be evaluated is indicated with the reference number 44 in FIG. 2.

The sensor 18 has here a receiver circuit composed of an inductor 46 and a capacitor 48. This receiver circuit is connected to what is referred to as a Tag reader 50, i.e. a circuit which actuates and evaluates the transponder. Suitable Tag readers are available today as integrated circuits (ICs). The Tag reader 50 uses the circuit 46, 48 to generate the electromagnetic field which actuates the transponder in the actuator 16 when the switching distance 44 is fallen short of. Furthermore, the circuit 46, 48 receives the response signal 42. In this case it generates a defined receiver circuit signal which is indicated with reference number 52 in FIG. 2, and contains the information 40 stored in the memory 38. The defined receiver circuit signal 52 is evaluated in the Tag reader 50. At an output 54, the Tag reader 50 then provides the decoded information 40 for further processing. A further output is designated here by reference number 56 and supplies a clock signal which can be used to read out the decoded information 40 at the output 54.

The two outputs 54, 56 of the Tag reader 50 are fed to a microprocessor 58 which processes the information 40 decoded by the Tag reader 50. The corresponding program code for the microprocessor 58 is stored in an integrated memory 60.

At the output end, the microprocessor 58 is connected to an amplifier circuit 62. The microprocessor 58 uses it to generate, at a sensor-end output 64, an enable signal 66 which is fed to the safety switching device 22 via the line 26 in the preferred exemplary embodiment according to FIG. 1. The microprocessor 58 generates the enable signal 66 as a function of the information 40 decoded by the Tag reader 50 by comparing said information 40 with reference information 68 stored in the memory 60. If the information supplied by the Tag reader 50 corresponds to the reference information 68, it is to be assumed that the protective door 12 is closed, provided that the entire device is functioning without fault, which is checked cyclically in the way described in more detail below. If the information made available by the Tag reader 50 does not correspond to the stored reference information 68, or if the Tag reader 50 does not supply any decoded information at all, it is to be assumed that the actuator 16 is located outside the switching distance 44 from the sensor 18, i.e. that the protective door 12 is opened. In this case, the microprocessor 68 cancels the switching signal 66, which signals to the safety switching device 22 that the robot 14 has to be switched off.

The Tag reader 50 and the microprocessor 58 thus together form a detector circuit in the sense of the present invention.

One input of the sensor 18 to which the line 24 from the safety switching device 22 (FIG. 1) is connected is designated by the reference number 70. Over said line the sensor 18 receives test pulses which the safety switching device 22 can use to check the satisfactory functioning of the sensor 18.

According to a preferred aspect of the present invention the checking is carried out here using a switching element 72 which is arranged in the region of the receiver circuit 46, 48. The switching element 72 is embodied here as a pnp-type transistor and connected by its collector and emitter terminals between the inductor 46 and the capacitor 48. The base of the switching element 72 is connected to the input 70 of the sensor 18 via a resistance network. By applying a suitable control signal (here a high signal) to the input 70 it is possible to disconnect the connection between the inductor 46 and capacitor 48 using the switching element 72, which results in the circuit 46, 48 not being able to provide an electromagnetic field which is suitable for interrogating the actuator 16. As a result of this, the actuator 16 cannot react with a response signal 42 either, even if it is located within the switching distance 44. Interruption of the circuit 46, 48 thus results in the Tag reader 50 no longer receiving the anticipated receiver circuit signal 52. When the sensor 18 is functioning satisfactorily, this must lead to a situation in which the microprocessor 58 cancels the enable signal 66. Correspondingly, the safety switching device 22 can realistically test the method of functioning of the sensor 18 by applying a suitable test signal to the input 70, without the protective door 12 having to be actually opened.

In the preferred exemplary embodiment, the switching element 72 is connected between the inductor 46 and the capacitor 48 in the way illustrated in FIG. 2. Alternatively, it is also possible to connect the switching element 72 between the receiver circuit 46, 48 and the Tag reader 50, which also results in the defined receiver circuit signal 52 being suppressed from the point of view of the Tag reader 50 if a suitable switching signal is present at the input 70. Furthermore, the use of the pnp-type transistor shown here is only a preferred possibility and the switching element 72 can also be implemented equally well in other ways.

The sensor 18 has in the exemplary embodiment here two further inputs 74, 76 to which a supply voltage of 24 volts in each case can be applied. A power supply unit 78 which is connected to the inputs 74, 76 generates a 5 volt operating voltage therefrom using a voltage regulator 80, said operating voltage supplying, in particular, the Tag reader 50 and the microprocessor 58.

In addition, reference number 82 designates a filter circuit via which the signal which is applied to the input 70 of the sensor 18 is also supplied to the microprocessor 58. With this filter circuit 82 it is possible to place the microprocessor 58 in a learning mode by means of a suitable signal at the input 70, this being, for example, a signal with a specific frequency in the implementation currently preferred. The filter circuit 82 generates, from the signal at the input 70, a status signal which signals to the microprocessor 58 that it is to store the information decoded via the Tag reader 50 in the memory 60 as reference information 68. In this way it is possible to train the sensor 18 to an individual actuator 16 so that subsequently only this actuator 16 (or some other actuator in which the same information 40 is stored) can then signal a closed protective door 12. However, in contrast to this embodiment it is basically also possible to store the reference information 68 in the memory 60 in some other way, for example when programming the microprocessor 58.

After the learning process, the safety switching device 22 cancels the signal at the input 70 and goes into the normal monitoring mode. In this monitoring mode, the safety switching device 22 actuates the switching element 72 cyclically in order to interrupt the receiver circuit 46, 48. If the microprocessor 58 then cancels the enable signal 66, it is possible to assume that the sensor 18 is functioning satisfactorily. However, if the microprocessor 58 does not react to the interruption in the receiver circuit 46, 48, an undefined and thus critical state is present, which leads to a situation in which the safety switching device 22 switches off the robot 14.

Since the safety switching device 22 can easily check the sensor 18 from the outside, it is possible to implement, within the sensor 18, a single-channel design which can additionally be done with very simple and thus cost-effective components. Moreover it is thus possible to implement the connection between the sensor 18 and safety switching device 22 in a single-channel fashion. As a result, the sensor 18 can be implemented with a relatively small M8 plug in the exemplary embodiment illustrated here, while prior art devices generally require a larger and thus more expensive M12 plug.

In the exemplary embodiment here, the learning mode is preferably actuated by a particular wire bridge being placed on the safety switching device 22 and causing the safety switching device 22 to apply the necessary signal to the line 24. However, as an alternative it would also be possible to use other solutions, for example to employ a key switch.

What is claimed is:

1. A device for reliably monitoring a closed position of two parts moveable relative to one another, the device comprising an actuator and a sensor each for mounting to one of the parts, the sensor comprising a receiver circuit having an inductor and a capacitor connected to one another for generating a defined receiver circuit signal when a distance between the sensor and the actuator is less than a predetermined switching distance, the sensor further comprising a detector circuit connected to the receiver circuit for providing an enable signal when the defined receiver circuit signal is present, and a switching element designed to selectively suppress the defined receiver circuit signal by electrically isolating the detector circuit from at least one of the inductor and the capacitor.

2. The device of claim 1, wherein the switching element is arranged in the region of the receiver circuit.

3. The device of claim 1, wherein the actuator comprises a transponder element with information stored therein, and wherein the sensor is designed to read out the information using the receiver circuit when the actuator and sensor are within said predetermined switching distance.

4. The device of claim 3, wherein the sensor is designed to read out the information in a continuously repeated fashion when the actuator and sensor are within said predetermined switching distance.

5. The device of claim 1, wherein the detector circuit comprises a logic module which provides the enable signal only if the information from the actuator corresponds to predefined information.

6. The device of claim 5, wherein the detector circuit has an operating mode in which the logic module is configured to read in the predefined information.

7. The device of claim 1, further comprising an evaluation and control unit designed to suppress the first receiver circuit signal cyclically using the test element.

8. The device of claim 7, wherein the evaluation and control unit is spatially remote from the sensor.

9. The device of claim 1, wherein the detector circuit is of single-channel design.

10. The device of claim 1, wherein the two parts form a protective door for safeguarding a technical installation operating in an automated fashion.

11. A sensor for detecting the presence of an actuator mounted to a first part that is moveable relative to a second part, the sensor being adapted to be mounted to the second part and comprising a receiver circuit having an inductor and a capacitor connected to one another for generating a defined receiver circuit signal when the actuator comes close to the sensor, comprising a detector circuit connected to the receiver circuit for providing an enable signal when the defined receiver circuit signal is present, and further comprising a switching element designed to selectively suppress the defined receiver circuit signal by electrically isolating the detector circuit from at least one of the inductor and the capacitor.

12. A method for reliably monitoring a closed position of two parts moveable relative to one another, the method comprising the steps of:

arranging an actuator on one of the parts, arranging a sensor having a receiver circuit comprising an inductor and a capacitor connected to one another on the other of the parts, generating a defined receiver circuit signal using the receiver circuit when the distance between the sensor and the actuator is less than a predetermined switching distance, generating an enable signal using a detector circuit if the defined receiver circuit signal is present, and when the defined receiver circuit signal is present, briefly suppressing the defined receiver circuit signal using a switching element for isolating the detector circuit from at least one of the inductor and the capacitor, and generating a monitoring message if the detector circuit does not react to the suppression of the defined receiver circuit signal.

\* \* \* \* \*